Nov. 2, 1971 R. A. BECK 3,616,532
MULTILAYER PRINTED CIRCUIT ELECTRICAL
INTERCONNECTION DEVICE
Filed Feb. 2, 1970

INVENTOR
RONALD A. BECK
BY Thomas J. Nikolai
ATTORNEY

United States Patent Office 3,616,532

Patented Nov. 2, 1971

3,616,532

MULTILAYER PRINTED CIRCUIT ELECTRICAL INTERCONNECTION DEVICE

Ronald A. Beck, Bloomington, Minn., assignor to Sperry Rand Corporation, New York, N.Y.

Filed Feb. 2, 1970, Ser. No. 7,931
Int. Cl. H05k 3/36
U.S. Cl. 29—625 2 Claims

ABSTRACT OF THE DISCLOSURE

A method and apparatus for establishing interconnections between conductive layers in multilayer printed circuit assembly wherein a solder coated compression type coil spring is inserted into an aperture in an insulating substrate which is positioned between the layers of circuitry which is to be interconnected. Upon heating, the solder melts to permit the spring to expand and thereby establish contact between the conducted surfaces. When the solder again cools, a positive and extremely reliable connection is established.

BACKGROUND OF THE INVENTION

The prior art is replete with various methods and apparatus for interconnecting conductive layers of printed circuitry. For example, reference is made to the Feldman Pat. 3,148,310 which shows the use of conductive spheres, the Prohofsky Pat. 3,187,426 which shows the use of a metallic wick, the Brown Pat. 3,193,788 which discloses a conductive pin and the Webb Pat. 3,321,570 which discloses the use of a bellows rivet. While the millions of dollars that government and industry have spent on circuit miniaturization have resulted in basic circuit-size reduction exceeding an order of magnitude, the interconnection devices for the circuits have not been similarly reduced in size. In fact, in at least one micro-miniaturization approach, the circuit interconnector is as large as the circuit module itself. The difficulties contributing to the miniaturization of connectors stem from the many things that must be achieved at the same time:

Low ratio of interconnection volume to circuit volume.
Inherent reliability.
Low cost.
Elimination of excessively tight manufacturing tolerances.
Suitability for automation.

The design problem is compounded when a method of interconnections is sought that is general enough to be suited to all of the major microminiaturization approaches.

The interconnection technique of the present invention overcomes most of the disadvantages found in prior art interconnection devices and in addition goes a long way in meeting the foregoing list of desirable attributes. Specifically, the interconnection device of the present invention comprises, in its simplest form, a coil type compression spring. The spring is pretreated by inserting it in a molten solder bath while a twisting force or a compressing force tending to reduce the diameter of the spring and/or shorten its length is applied. When the spring is withdrawn and the solder has cooled, the spring is "frozen" in its compressed state. In accordance with a first embodiment of the invention, these spring members are inserted in apertures provided in an insulating substrate and this substrate is positioned between conductive layers in the multilayer printed circuit package. After the desired interconnection points are all aligned with the interconnecting spring in a desired fashion, the assembly is subjected to an elevated temperature above the melting point of the solder. As the result, the springs are freed to expand and establish a connection between layers of printed circuitry. When the heat is removed, the solder again solidifies and establishes an excellent electrically soldered connection between the printed circuit layers and the interconnecting spring element.

Because of the manner in which the springs are initially prepared, the new interconnection scheme is found to alleviate the tight tolerances usually found in microminiature fittings. Also, it completely obviates the need for a special mating socket. The reliability achieved through the mechanical and solder contact is excellent and because of the simplicity, the cost of the interconnection is low.

It is therefore an object of this invention to provide an improved electrical connection between layers of printed circuitry in a multilayer printed circuit board configuration. It is another object of this invention to provide a method and apparatus for interconnecting the various circuit levels of a printed circuit assembly which permits disassembly in the event a circuit change is desired.

It is still another object of this invention to provide a method and apparatus for electrically interconnecting individual circuit cards in a multilayer printed circuit configuration which compensates for variations in the planar mating surfaces of adjacent cards.

It is still another object of this invention to provide a multilayer circuit assembly interconnecting means which permits a cost saving in the production of printed circuit cards used in assembly.

These and other more detailed and specific objectives will be disclosed in the course of the following specification, reference being made to the accompanying drawings in which.

Figure 1:
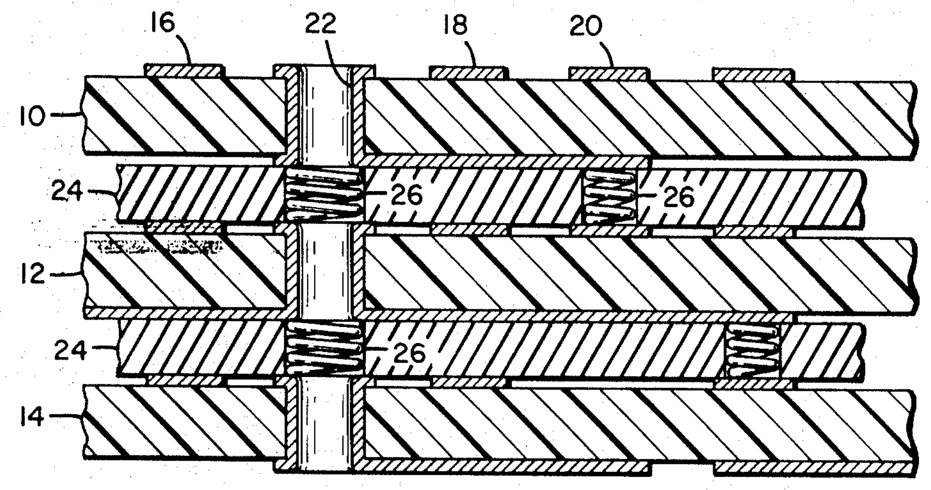
FIG. 1 illustrates by means of a cross-sectional view the method and apparatus comprising a preferred embodiment of the invention.

Referring first to FIG. 1, there is shown in cross-section a typical multilayer printed circuit board configuration which incorporates the interconnection technique of the present invention. More particularly there is shown a plurality of printed circuit boards 10, 12, and 14 having a pattern of printed circuitry formed on either or both sides thereof by conventional printed circuit techniques. The board 10 is shown as including a pattern of conductive elements 16, 18, 20 etc. along with the so-called "plated through hole" 22. The plated through hole comprises an aperture formed through the printed circuit substrate with a metalization layer interconnecting the printed circuit pattern on one side thereof to the printed circuit pattern on the opposite thereof. Processes are well known in the art for producing printed circuit boards with plated through holes.

In a multilayer printed circuit module, it is necessary to establish electrical connection, not only between opposite sides of the same printed circuit layer but also between sides of different printed circuit layers. In accordance with the teachings of the present invention, this is accomplished by providing an intermediate insulating substrate 24 between each layer of printed circuitry 10, 12, 14 to be interconnected. At predetermined locations where it is desired to establish electrical continuity between layers, an aperture or hole is drilled or otherwise formed in the intermediate insulating layers 24.

Prior to the assembly of the module, a coil spring is compressed and inserted into a pot of molten solder. It is subsequently withdrawn from the pot and the solder is allowed to solidify to thereby hold the coils of the compression spring tightly together against the restoring force of the spring. These springs are then inserted into the apertures formed in the intermediate layers 24 as illustrated at 26 in FIG. 1. The assembly is then clamped together and subjected to an elevated temperature such that the solder holding the coils of the spring members 26 again liquifies to release the spring tension. The springs are therefore permitted to expand and establish contact between abutting printed circuit levels. After the heat is removed, the solder again solidifies and establishes a positive solder connection between the printed circuit pattern on a first layer with a printed circuit pattern on a second layer.

Figure 2:
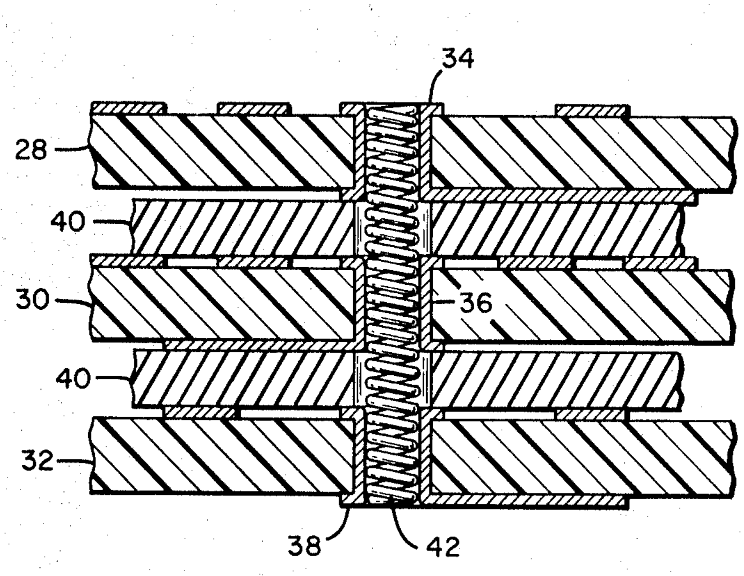
FIG. 2 is a cross-sectional view illustrating an alternative form of the invention.

Referring next to FIG. 2 there is shown an alternative embodiment wherein the interconnection technique of the present invention is utilized to interconnect aligned plated through holes on a plurality of printed circuit boards. In FIG. 2 there is shown a number of layers of printed circuitry 28, 30, and 32. Each of these layers is shown to include a plated through hole 34, 36, and 38. The printed circuit patterns on the opposed faces of printed circuit boards 28, 30 and 32 are insulated from one another by a layer 40 of a suitable insulating material. The layer 40, however, also causes a gap to be created between the land areas surrounding the printed through holes on adjacent boards so that they too remain out of electrical contact.

To establish the desired continuity between the plated through hole areas on the printed circuit board 28, 30, and 32, again a spring member is first compressed by twisting same on a mandrel so as to decrease its diameter. While in this strained condition, the spring member is placed in a solder bath and the solder is permitted to solidify to hold the coils in their tensed condition. Subsequently, the spring member 42 is inserted through the aligned apertures 34, 36 and 38. Because of the reduced diameter, it is a simple matter to insert the coiled spring, Subsequently, the printed circuit assembly is subjected to a temperature above the melting point of the solder and the tension of the coil spring is released so that it expands in diameter and firmly abuts the walls of the plated through holes in the printed circuit boards. When the elevated temperature is removed, the solder again solidifies to establish a reliable electrical connection between the metalized walls of the plated through holes and the coils of the spring.

Of course, in practice, the solder coated spring member would be prepared in advance and a supply of them would be available to the operator who is given the task of preparing the multilayer configuration. Because upon release of the spring member the spring expands to firmly contact the walls of the plated through holes, it is not necessary to maintain severe tolerances which may otherwise be required if certain of the prior art interconnection techniques are employed.

Figure 3:
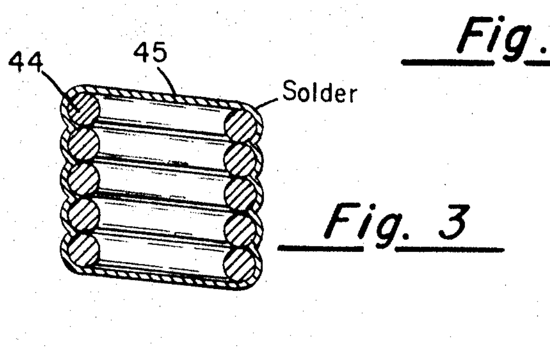
FIG. 3 shows a spring element which has been compressed and then dipped in solder.

A typical spring in its compressed state is shown in FIG. 3. The spring 44 is maintained in such compressed state by the coating of solder 45. Upon melting of the solder 45, the spring 44 is released from its compressed state and expands axially and radially, in accordance with the teachings of the specification as set forth above, to make electrical contact with the plated apertures of the structures of FIGS. 1 and 2. It is to be understood that after the solder is melted and the spring expands as shown in FIGS. 1 and 2, there will still be a coating of solder on the springs, although such coating is not specifically shown in FIGS. 1 and 2. However, such coating of solder will no longer function to hold the spring in a compressed condition, Thus, it can be seen that this invention provides a new and improved method and means of interconnecting individual layers of a multilayer printed circuit board module. It is understood that suitable modification may be made in the structure which is disclosed herein without departing from the spirit and scope of the appended claims.

Having now, therefore, fully illustrated and described the invention, what is claimed to be new and what is desired to be protected by Letters Patent is:

1. A method for establishing an electrical connection between conductive layers in a multilayer printed circuit assembly comprising the step of:

providing a plurality of substrates having a pattern of conductors affixed thereto;

providing a plurality of insulating substrates having a predetermined pattern of apertures formed therein;

inserting, into at least some of said apertures, helical spring members which are held in a longitudinally compressed condition by a coating of solder;

sandwiching said insulating substrates between said plurality of substrates having a pattern of conductors affixed thereto;

heating the multilayer assembly above the melting point of the solder coating to permit said compressed spring members to expand to make an electrical connection between the conductor on said substrates; and cooling said assembly to allow said solder coating to resolidify.

2. A method for establishing an electrical connection between conductive layers in a mutilayer printed circuit assembly comprising the steps of:

providing a plurality of insulating substrates having a pattern of conductors affixed thereto on each side thereof and a pattern of plated through holes interconnecting said pattern of conductors on opposite sides thereof;

juxtaposing said plurality of substrates such that the pattern of plated through holes on adjacent substrates are at least partially aligned;

inserting, into at least some of the aligned plated through holes, helical spring members which are held in a radially compressed condition by a coating of solder;

heating said assembly above the melting point of the solder to permit said compressed springs to expand to make an electrical connection between conductive layers in said multilayer printed circuit; and cooling the assembly below the freezing point of the solder.

References Cited

UNITED STATES PATENTS

| | | | |
|---|---|---|---|
| 3,047,683 | 7/1962 | Shlesinger, Jr. | 174—68.5 UX |
| 3,258,736 | 6/1966 | Crawford et al. | 339—17 UX |
| 3,281,751 | 10/1966 | Blair | 339—17 |
| 3,509,270 | 4/1970 | Dube et al. | 174—68.5 |

DARRELL L. CLAY, Primary Examiner

U.S. Cl. X.R.

174—68.5; 317—101 CM; 339—17 C